United States Patent [19]

Ziegler, Jr.

[11] Patent Number: 4,878,188

[45] Date of Patent: Oct. 31, 1989

[54] SELECTIVE ACTIVE CANCELLATION SYSTEM FOR REPETITIVE PHENOMENA

[75] Inventor: Eldon Ziegler, Jr., Columbia, Md.

[73] Assignee: Noise Cancellation Tech, Columbia, Md.

[21] Appl. No.: 238,188

[22] Filed: Aug. 30, 1988

[51] Int. Cl.⁴ .............................................. G06F 15/31
[52] U.S. Cl. .................................... 364/724.01; 381/71
[58] Field of Search ....................... 364/724.01, 724.19; 381/71

[56] References Cited

U.S. PATENT DOCUMENTS

| 4,122,303 | 10/1978 | Chaplin et al. | 381/71 |
| 4,153,815 | 5/1979 | Chaplin et al. | 381/71 |
| 4,417,098 | 11/1983 | Chaplin et al. | 381/43 X |
| 4,649,505 | 3/1987 | Zinser, Jr. et al. | 381/71 X |
| 4,677,676 | 6/1987 | Eriksson | 381/71 |
| 4,677,677 | 6/1987 | Eriksson | 381/71 |

FOREIGN PATENT DOCUMENTS 2088951 6/1982 United Kingdom ................ 381/71

OTHER PUBLICATIONS

"Adaptive Noise Cancelling Principles and Applications", Widrow et al., Proceedings of IEEE, vol. 63, No. 12, Dec. 1975, pp. 1692-1716.
"Adaptive Noise Cancelling of Sinusoidal Interferences", Ph.D. Dissertation, Stanford University, Stanford, CA, May 1975, Glover, Jr.

Primary Examiner—Gary V. Harkcom
Assistant Examiner—Tan V. Mai
Attorney, Agent, or Firm—Barnes & Thornburg

[57] ABSTRACT

A cancellation system including a processor having single adaptive filters adapting its filtering characteristic as a function of a phenomena signal and phenomena timing signal and a phase circuit to maintain the adapting of the filtering characteristics within 90 degrees phase of the phenomena signal. The phase circuit has the capability to measure the delays of the processor and the environment.

9 Claims, 5 Drawing Sheets

SELECTIVE ACTIVE CANCELLATION SYSTEM FOR REPETITIVE PHENOMENA

BACKGROUND AND SUMMARY OF THE INVENTION

The present invention relates generally to active cancellation systems for repetitive phenomena, and more specifically to a fast adapting, low-cost solution to this problem.

Linear flow, air duct systems, for example, Chaplin U.S. Pat. No. 4,122,303; Warnaka, U.S. Pat. No. 4,473,606 and Eriksson U.S. Pat. Nos. 4,677,676 and 4,677,677, take advantage of directional flow in linear, one dimensional flow to utilize an upstream sensor, followed by a cancellation actuator and downstream error sensor in sequence. These systems cancel repetitive and random noise. Chaplin characterizes the controller as a general convolution process, including a "programme of time-related operational steps." Warnaka uses adaptive filters to speed adaptation time and allow greater spacing between the speaker and the duct. Eriksson specifies recursive least mean square (RLMS) and least mean square (LMS) adaptive filters to perform the convolutions and measure the system transfer functions in the presence of noise.

These systems fail to utilize external synchronization timing to provide selective cancellation of repetitive Phenomena in one to three dimensional applications.

Systems for cancelling repetitive noise and vibration, for example, Chaplin U.S. Pat. Nos. 4,153,815 and 4,417,098, describe the use of a synchronizing timing signal to provide selective cancellation of repetitive noise or vibration. Additionally a controller, actuator and error sensor are used. The method presented by Chaplin in these patents divides the noise or vibration period into a number of intervals and adjusts the amplitude of the cancelling signal within each interval in response to the sign or amplitude of the error sensor within the same or a delayed interval.

In U.S. Pat. No. 4,490,841, Chaplin describes the use of Fourier transforms to process signals in the frequency domain. While this method might be used for random signals, processing time requirements generally limit its application to repetitive signals.

These systems use expensive or complicated filters and do not account for variable delays in the system.

Cancellation of unwanted components within electronic signals generally is applied to communication signals. Rennick et al. in U.S. Pat. No. 4,232,381, use a commutating filter synchronized to the rotation of an engine to cancel self-generated engine noise within an electronic circuit. The level of the cancelling signal is adjusted manually and no method is provided to adapt to phase shifts or varying amplitudes of different harmonics.

Garconnat et al. in U.S. Pat. No. 4,594,694 use two sensors, one sensing both the wanted and unwanted signals and the other sensing only the unwanted signals. Narrow band filters or Fourier transforms are used to eliminate the unwanted signals from the combined signal.

Widrow in "Adaptive Noise Cancelling Principles and Applications", Proceedings of the IEEE, Vol. 63, No. 12, December, 1975, describes two forms of active adaptive cancellers. The first, as illustrated in FIG. 1, uses a multi-tap adaptive FIR filter with a reference signal correlated with the noise to be cancelled. The reference signal is required to be within 90° in phase of the error signal. Consequently, the reference signal used by the adapter itself often requires filtering; the resulting approach is referred to as the "filtered-x algorithm."

The second form described by Widrow, as illustrated in FIG. 2, provides a single frequency notch filter and requires only two single tap filters. Again, a reference signal correlated with the noise is used and is phase shifted 90° for one of the filter. Glover, in "Adaptive Noise Cancelling of Sinusoidal Interferences," Stanford University, Stanford, California, May 1975, Ph.D. dissertation, extended this technique to multiple frequencies.

Thus it is an object of the present invention to provide an improved selective active cancellation system for repetitive phenomena.

Another object is to provide an active cancellation system using relatively inexpensive and uncomplicated filters in combination with external synchronized timing.

A still further object of the present invention is to provide an improved rate of adaptation to changes in the level or frequency of the repetitive phenomena.

A still even further object of the present invention is to provide a cancellation sYstem for rePetitive phenomena which accounts for variations in processing time and environmental produced delays.

A still even further object of the present invention is to provide selective cancellation of unwanted signal components and automatic adaptation to the levels and phases of the signal components utilizing synchronization timing signals and a single residual sensor.

A still even further object of the present invention is to Provide for adaptation of the system to maintain an appropriate Phase relationship without the use of external reference signals.

These and other objects are obtained by providing a processor which receives phenomena input signals and timing input signals representing the phenomena to be cancelled and the repetition rate of the phenomena respectively, and which includes inexpensive and simple adaptive filters for generating a cancellation signal by adapting its filtering characteristics as a function of the sum of the signal, and a phase circuit for maintaining the adapting of the filtering characteristics within a 90° phase of the phenomena signal. The adaptive filter includes for each frequency to be cancelled, be it a single frequency and its harmonics or a plurality of fundamental frequencies, a sine and cosine generator responsive to the timing signal and providing inputs to first and second adaptive filters whose outputs are summed to provide the cancellation signal. First and second adaptors adapt the first and second filter weights of the first and second filters as a function of the sensed phenomena signal which represents the residual phenomena and a signal received from the phase circuit so that the first and second adapter operates within 90° phase of the phenomena signal.

The phase circuit measures the delay between providing the cancellation signal and receipt of the Phenomena signal and adjusts the phase as a function of the measured delay. The Phase circuit also takes into account and adjusts the phase as a function of the processing delay of the processor. The phase circuit includes a test signal generator for generating a test signal which is combined with the cancellation signal and provided into the area to be monitored. A third adaptive filter is provided for receiving the test signal and providing a filtered signal. A difference is taken of the filtered signal with the phenomena residual signal. An adapter adapts the third filter weights as a function of the difference signal and a delayed test signal. The third filter weights represent the delay time of the system and are used to provide the appropriate phase correction.

Other objects, advantages and novel features of the present invention will become apparent from the following detailed description of the invention when considered in conjunction with the accompanying drawings.

DETAILED DESCRIPTION OF THE INVENTION

Figure 1:
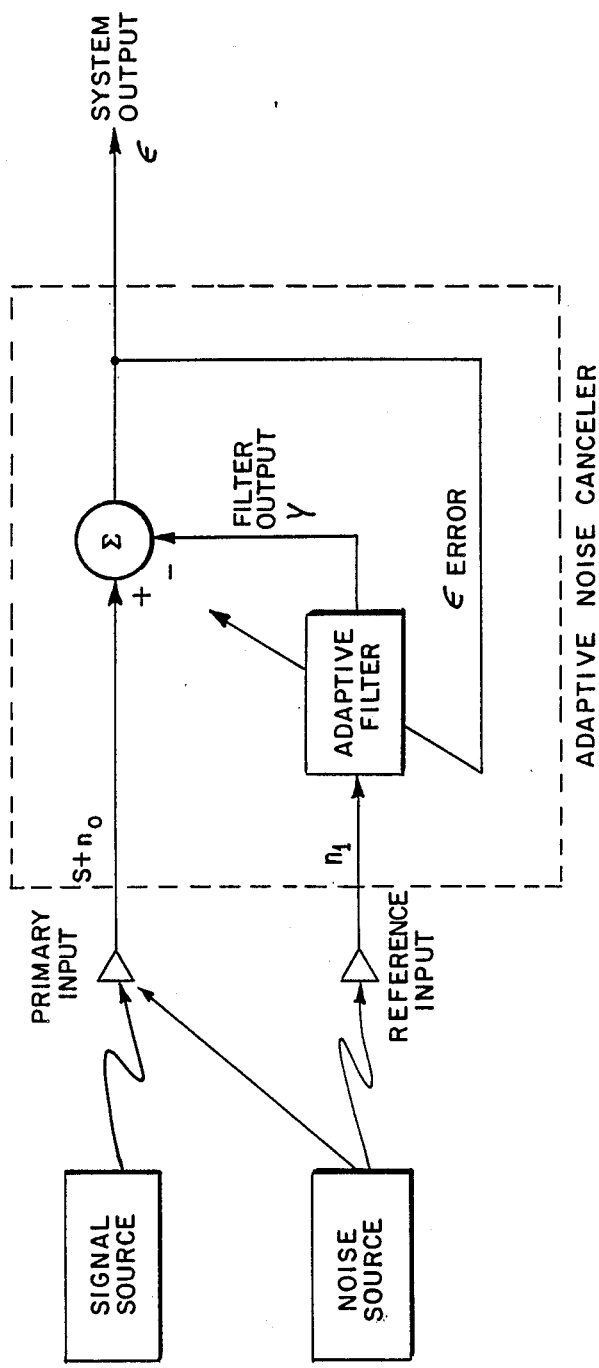
FIG. 1 is an adaptive noise cancellation concept of the prior art.
Figure 2:
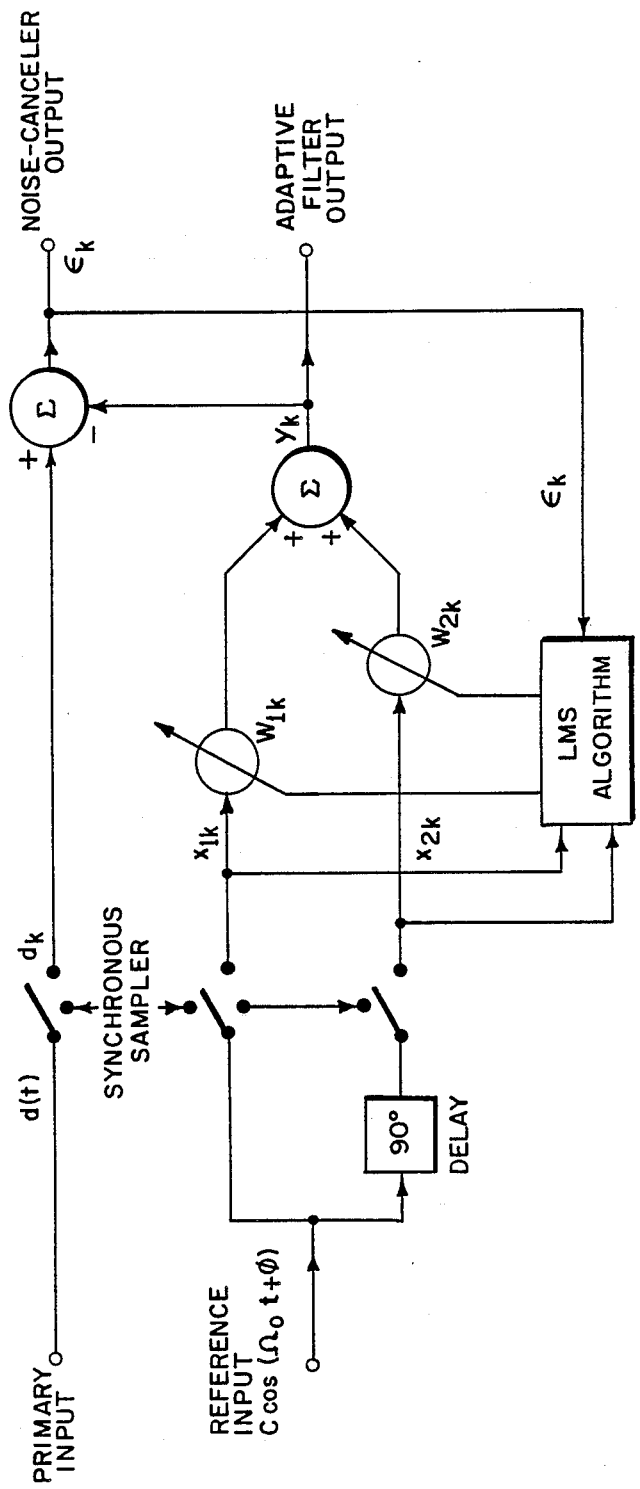
FIG. 2 is a single frequency adaptive notch filter of the prior art.
Figure 3:
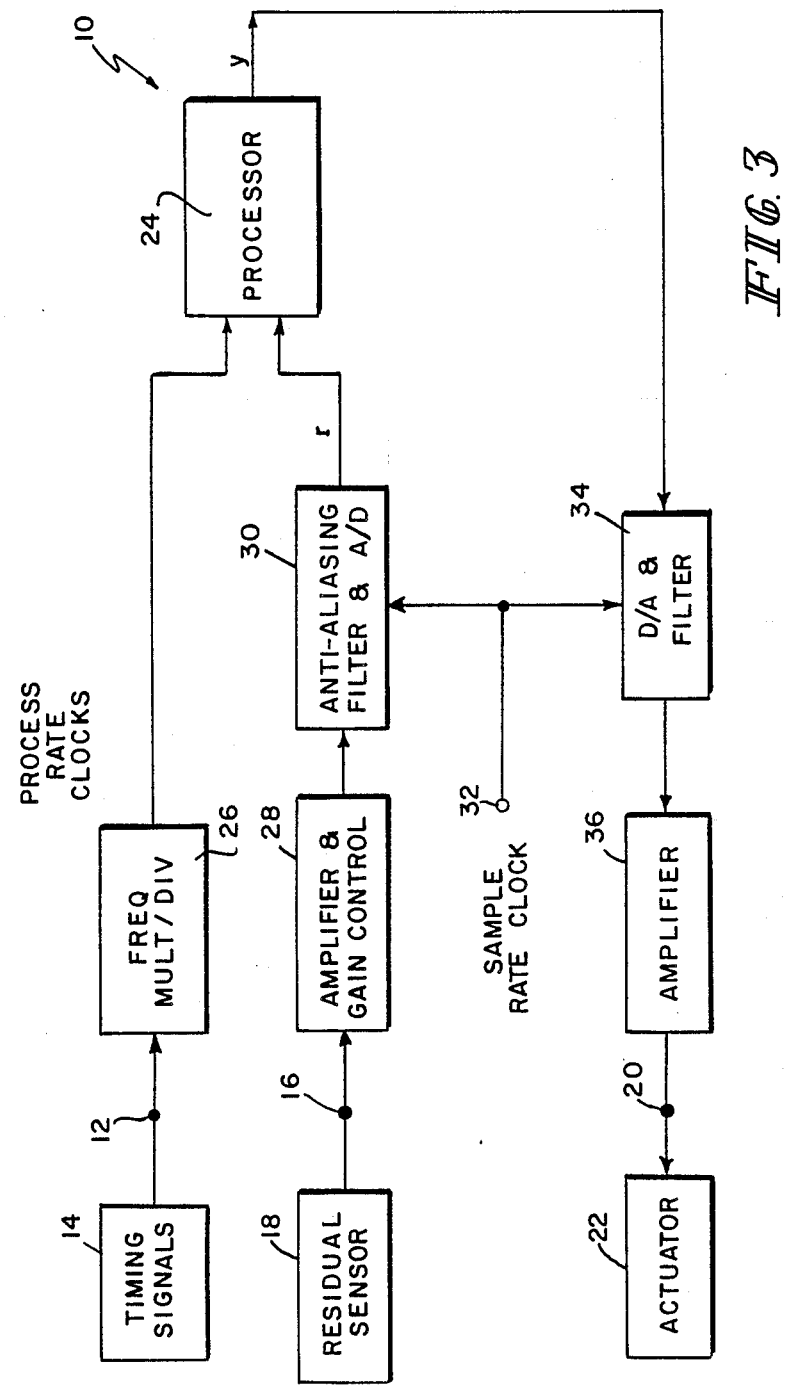
FIG. 3 shows a block diagram of a selective cancellation controller according to the principles of the Present invention.

The repetitive phenomena cancellation controller 10 of the present invention includes an input 12 for receiving a source of timing signals from 14 and input 16 for receiving the signals from the residual or phenomena sensor 18 and an output 20 cancellation signal to drive an actuator 22 to provide a cancelling phenomena into the area to be controlled.

The rate o timing signal sensor at input 12 is used to determine the fundamental frequency at which the repetitive Phenomena is being generated. Multiple timing signals are used when the repetitive phenomena arises from sources occurring at different rates. This signal, or signals, may be for example, from an engine tachometer, an optical sensor on moving equipment, a "clock" signal from electronically controlled or generated noise sources or by determining the rate from the repetitive phenomena itself, such as by use of a phased-locked-loop to track its timing. Alternately, when the rate is stable, an independent timing device, such as a precision function generator, can provide the timing signal.

The actuator 22 produces the cancelling repetitive phenomena from an electronic waveform to interact with the original repetitive phenomena such that the two sum algebraically. The actuator 22 can be, for example, a loudspeaker, headphone or other acoustic actuator; an electro-mechanical, electro-hydraulic, piezoelectric or other vibration actuator; or an electronic mixing circuit.

The sensor 18 detects the result of algebraically summing the original repetitive phenomena and the cancelling repetitive phenomena and converts this into an electronic waveform representing this residual. The residual sensor 18 might be, for example, a microphone, accelerometer, pressure sensor or the output of an electronic mixing circuit.

The controller 10 utilizes the timing signal(s) and residual sensor waveform to produce the cancelling waveform.

A timing input or electronic circuitry 26 converts the timing signal(s) for use in a processor 24. Such circuitry typically includes amplifiers, pulse shaping functions and possibly an adjustable rate frequency multiplier/divider, such as a phased-lock-loop and counter, to increase/decrease the rate of the timing signal as required by the processor, for example to multiply a once-per-rev tachometer signal by the number of points to be processed per rev. The output is a Process rate clock signal.

Phenomena input electronic circuitry 28, 30 converts the residual sensor signal for use in a processor 24, such circuitry typically consists of amplifiers 28, possibly with controllable gain, anti-aliasing filters 30, a sample-and-hold function and an analog-to-digital converter.

Output electronic circuitry converts output signals from the processor 24 into the cancelling waveform. Such circuitry typically consists of a digital-to-analog converter, a reconstruction filter 34 to remove the sampling frequency and an amplifier 36, as required.

The processor 24 provides the following:

1. A means for synchronizing processing to the timing signal(s);

2. A means for determining and updating the system impulse response;

3. Cosine and sine values at intervals determined by the number of points to be processed per cycle;

4. Means for convolving the cosine and sine values within the system impulse response to maintain the adapation of the filters weights within a 90° phase of the phenomena or residual signal;

5. Storage for the filter weights;

6. Means for adapting the filter weights utilizing the residual signal value and the convolved cosine and sine values to minimize a function of the residual signal, such as an LMS algorithm; and 7. A means for producing the cancelling signal from the filter weights and the cosine and sine values.

The timing signal(s) synchronize processing with the rate(s) at which the repetitive phenomena is being produced. These rates determine the length of a repetition cycle, depending on the source of the phenomena. For example, a repetition cycle occurs every revolution of an electric motor and every other revolution of a four cycle engine. This rate also determines the fundamental frequency of the repetitive phenomena. For example, an electric mo or running at 1800 RPM completes 30 revolutions per second with a fundamental frequency of thirty Hertz. A four cycle diesel engine running at 1800 RMP also completes thirty revolutions per second, but with only fifteen complete firing cycles per second and a fundamental frequency of fifteen Hertz.

The timing signal(s) are frequency multiplied and/or divided, if necessary, to produce the process rate clock(s) providing Sn points within each repetition cycle. Often Sn is a power of two, such as 128, to facilitate computation.

The processor 24 can be synchronized with the process rate clocks via interrupts, digital interfacing or other methods of interfacing the process rate clocks with the processor.

The sample rate clock on input 32 can be set to a fixed rate or taken directly from the process rate clock. Some degradation of cancellation can occur if a fixed rate is used but a simpler system can result since fixed frequency filters can be used.

The processor 24 can be implemented in various forms including fixed program hardware, custom chips or in one or more stored program microprocessors. The functions of the processor 24 are to compute and update filter weights that result in minimizing the mean square value of the error signal and, when needed, to determine the sampling rate and system impulse response.

The processor can be configured to cancel a single fundamental frequency plus harmonics or to cancel multiple frequencies, each possibly with harmonics.

Figure 4:
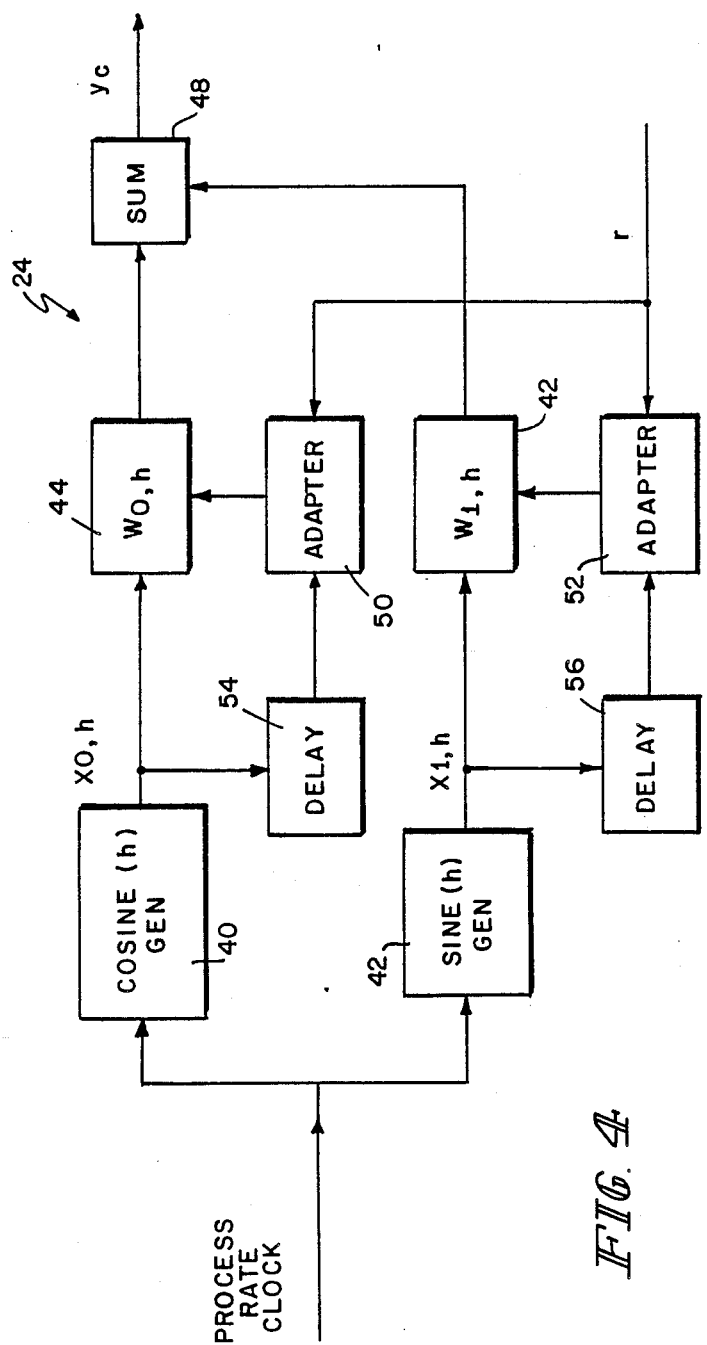
FIG. 4 is a block diagram of a single fundamental frequency cancellation processor according to the principles of the present invention.

Referring to FIG. 4, the cancellation signal $Y_c$ at time t for a single fundamental frequency processor is computed as:

$$y_c[t] = -\Sigma_h(w_{0,h}[t] + w_{I,h}[t] * x_{1,h}[t]),$$

where
 $w_{0,h}[t]$ and $w_{I,h}[t]$ are the values of the filter weights for harmonic h at time t; and,
 $x_{0,h}[t] = \cos(h * 2 * pi * t/Sn)$
 $x_{I,h}[t] = \sin(h * 2 * pi * t/Sn)$
where Sn is the number of points processed per repetition cycle; h is the harmonic index, 1 for the fundamental, 2 for the first harmonic, etc.,; and, t sequences between 0 and Sn-1, changing at each processing time interval.

A cosine and sine generator 40, 42 provides values at the fundamental frequency and harmonics of the process rate clock. The output of the sine and cosine generator $x_{0,h}$ and $x_{I,h}$ are provided to respective filters 44, 46 having weighting functions $w_{0,h}$ and $w_{I,h}$. The output of the filters 44 and 46 are summed in the summer 48 to provide the output cancellation signal $y_c$. Filter weighing adaptors 50, 52 receive the residual signal r and modify it with the delayed signal from the sine and cosine generator through delay circuits 54, 56 respectively.

The adapters 50, 52 can be of any type that minimize the residual r, such as a LMS algorithm. When an LMS algorithm is used the filter weights are updated as:

$$w_{0,h}[t] = w_{0,h}[t-1] \pm alpha * r * x_{0,h}[t - Delay_h]$$

$$w_{I,h}[t] = w_{I,h}[t-1] \pm alpha * r * x_{I,h}[t - Delay_h]$$

where $Delay_h$ is the effect of the system impulse response at harmonic h and alpha is set to assure convergence.

The delay circuits 54, 56 reproduce the effects of the system impulse response from the cancellation signal $y_c$ to the residual signal 4. This impulse response includes the effects of the filters within the controller itself, which can dominate external factors. The purpose of the delay is to keep the $x_0$ and $x_I$ values going to the adapters 50, 52 within 90° phase of the residual signal r. Often, it is adequate to approximate the impulse response with a simple time delay. When that is not adequate, the delay circuits 54, 56 become convolutions of the signals $x_0$ and $x_I$ with the system impulse response.

Note that the values of the delay can depend upon the frequency, and thus, the harmonic.

Figure 5:
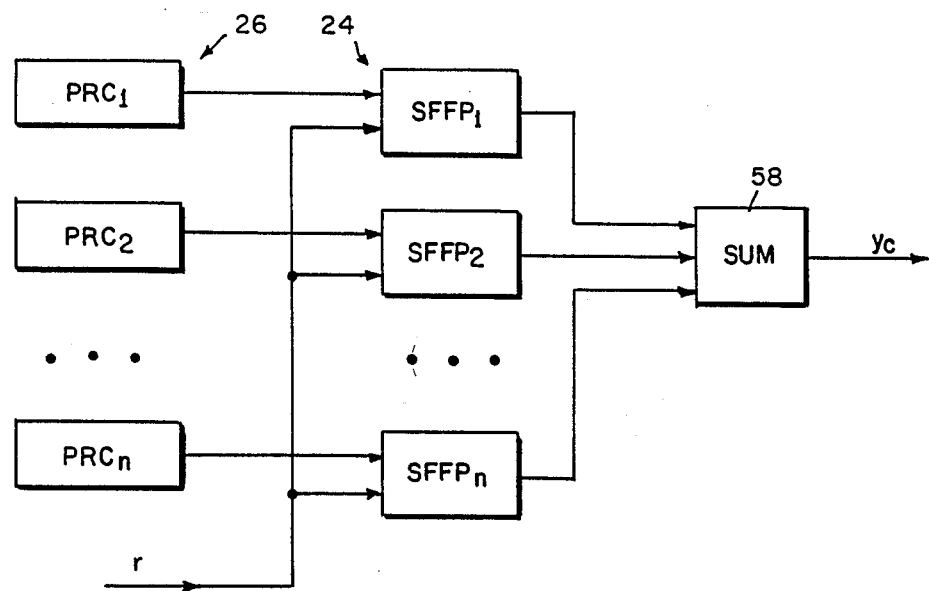
FIG. 5 is a block diagram of a multi-fundamental frequency cancellation processor according to the principles of the present invention.

Referring to FIG. 5, multiple processing rate signals can be utilized, one for each fundamental frequency. A plurality of process rate clocks PRC are shown being fed to their individual single fundamental frequency processors SFFP 24. Their outputs are combined in a summer 58. The single fundamental frequency processors 24 would each include the configuration of FIG. 4 having a pair of adaptable notch filters 44, 46, as well as the other circuitry illustrated therein.

The cancellation signal $y_c$ at time t is computed as:

$$y_c[t] = \Sigma_f(w_{0,f}[t] * + w_{I,f}[t] * x_{x,f}[t])$$

$$x_{0,f}[t] = \cos(2 * pi * t_f/Sn)$$

$$x_{I,f}[t] = \sin(2 * pi * t_f/Sn)$$

where Sn is the number of points processed per repetition cycle; and, $t_f$ sequences between 0 and Sn−1 independently for each fundamental frequency, changing a teach processing time interval.

As before, the adapters can be of any type that minimize the residual r, such as a LMS algorithm. When an LMS algorithm is used, the filter weights are updated as:

$$w_{0,f}[t] = w_{0,f}[t-1] \pm alpha * r * x_{0,f}[t - Delay_f]$$

$$w_{I,f}[t] = w_{I,f}[t-1] \pm alpha * r * x_{I,f}[t - Delay_f]$$

wherein $Delay_f$ is the effect of the system impulse response at frequency f; and, alpha is set to assure convergence.

Note that the values of delay depend on the frequency. Multiple harmonics of each fundamental frequency can be cancelled as described earlier.

The purpose of measuring the system impulse response is to adjust the cosine and sine values to be within 90° phase of the residual signal. In the general case the phase correction is accomplished by convolving the cosine/sine values with the system impulse response. Often, it is sufficient simply to delay the cosine/sine values by the delay introduced between the processor output and the residual value input. The delay can be caused by the anti-aliasing filters, reconstruction filters and delays in the environment, such as the distance between the actuator and residual sensor.

When the system time delay is fixed and know in advance, the values can be built into the processor and real-time measurement omitted.

When needed, several methods of measuring the system impulse response are available. These include a swept sine (single frequency) signal, an impulse generator, a pseudo random test signal correlated with the response and a pseudo random test signal plus an adaptive filter.

Figure 6:
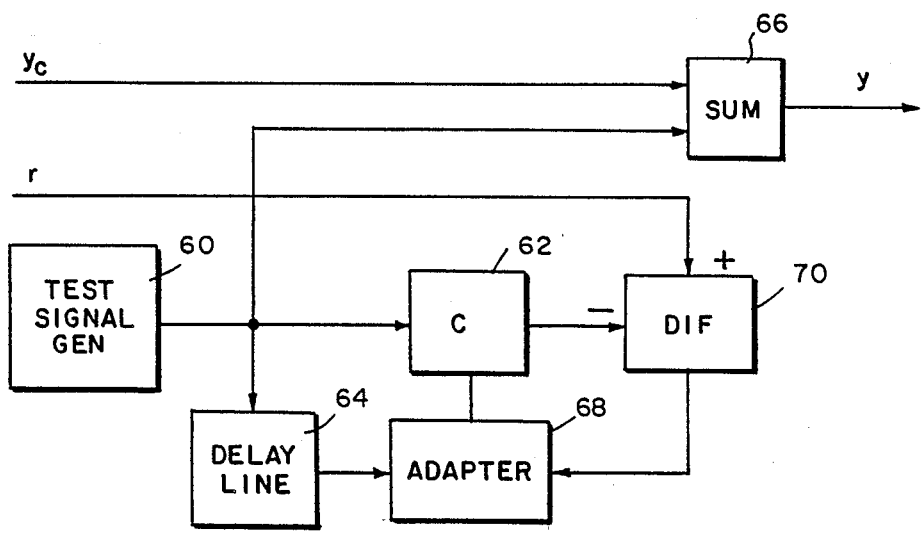
FIG. 6 is a block diagram of a system impulse measurement processor according to the Principles of the present invention.

The preferred approach, as illustrated in FIG. 6, utilizes a pseudo random test signal generator 60 plus an adaptive filter 62 to minimize storage requirements. The pseudo random test signal is stored in a delay line 64 and added to the cancellation output, $y_c$ at adder 66. The weights of the adaptive filter are adjusted by adapter 68 using a minimization algorithm, such as a LMS algorithm, by using the difference from 70 between the residual sensor value r and the convolution of the contents of the delay line and the filter weights. When an LMS algorithm is used, the weights are updated by:

$$C[t+1] = C[t] + alphaC * (r - C[t] \cdot PRTS[t]) * PRTS[t]$$

where C[t] is the vector of filter weights at time t; PRTS[t] is the delay line of pseudo random test signal values; C·PRTS[t] is the dot product of the vectors; r is the residual signal value; and, alphaC is set for convergence.

The resulting filter weights, C[t] approximate the system impulse response and are used by the processor 24 to set the delays 54, 56.

The preferred method of generating the pseudo random test signal is the use of a maximal length sequence generator. This sequence can be generated by:

$$d[t] = d[t-28] \text{ xor } d[t-31]$$

where d[t] is the binary value of the sequence at time t.
The test signal is generated by:
+ test signal level, d[t] = 1,
− test signal level, d[t] = 0.

When the system impulse response can be approximated by linear phase, a single value of the system time delay describes its response. Then the values of Delay$_h$ and Delay$_f$ can be provided by this single value. This value is adjusted to account for variations in the processing rate by:

$$Delay = td * Pr$$

where Delay is in processing interval units; td is the system time delay in seconds; and, Pr is the processing rate per second.

In the general case, the values of delay depend on the frequency. These delays can be determined by converting the impulse response into the frequency domain (e.g., by use of a Fourier or Hartley transform), and by calculating the delays from the phase values. An example of the calculation is:

$$td_f = \frac{-\text{phase}_f}{2 * pi * f}$$

where td$_f$ is the time delay at frequency f, in seconds; phase$_f$ is the phase at frequency f, in radians; and f is the frequency, in Hertz.

The values of Delay$_h$ or Delay$_f$ in FIG. 4 are then determined by $$Delay_{fh} = td_f * Pr$$

where fh = f$_o$ * h with f$_o$ the channel fundamental frequency and h is the harmonic index, or $$Delay_f = td_f * Pr$$

Alternatively, the delay values of the sine and cosine values can be determined as:

$$sin\ (theta + phase_f) = sin\ (theta)\ cos\ (phase_f) + cos\ (theta)\ sin\ (phase_f)$$

$$cos\ (theta + phase_f) = cos\ (theta)\ cos\ (phase_f) - sin\ (theta)\ sin\ (phase_f)$$

where
theta = 2*pi*h*t/Sn and
f = f$_o$ * h.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. Repetitive phenomena cancellation controller comprising:
   phenomena input means for providing a phenomena signal representing a Phenomena to be cancelled;
   timing input means for providing a timing signal representative of a repetition rate of said phenomena;
   processor means, having inputs for said phenomena signal and said timing signal, for generating a cancellation signal to substantially eliminate said phenomena;
   output means connected to said processor means for providing a cancellation phenomena as a function of said cancellation signal;
   adaptive filter means, in said processor means, for generating said cancellation signal by adapting the filter means filtering characteristics as a function of said phenomena signal and timing signal; and
   phase means, in said processor means, for maintaining said adapting of said filtering characteristic within a 90° phase of said phenomena signal.

2. A repetitive phenomena cancellation controller according to claim 1, wherein said adaptive filter means includes, for each frequency to be cancelled:
   sine and cosine means for generating a sine and cosine respectively of said timing signal;
   first and second filter means for receiving said sine and cosine signals respectively and providing first and second cancellation signals as a function of first and second filter weights of said first and second filtering means respectively;
   summing means for providing said cancellation signal as a sum of said first and second cancellation signals;
   first and second adapter means for adapting said first and second filter weights respectively as a function of said sine and cosine signals resPectively and said Phenomena signal; and
   wherein said phase means adjusts the phase of said sine and cosine signals provided to said first and second adapter means so that said first and second adapter means are within 90° phase of said phenomena signal.

3. A repetitive phenomena cancellation controller according to claim 2, wherein said phase means includes means for measuring a delay between providing said cancellation signal and receipt of said phenomena signal, and adjustment means for adjusting said phase as a function of a measured delay.

4. A repetitive phenomena cancellation controller according to claim 3, wherein said phase means includes means for measuring processing delays of said processing means and said adjusting means also adjusts said phase as a function of processing delay of said processor means.

5. A repetitive phenomena cancellation control according to claim 2, wherein said phase means includes:
   test signal means for generating a test signal, said test signal being provided to said output means;
   third filter means for receiving said test signal and providing a filtered signal as a function of third filter weights;
   difference means for providing a difference signal of said filtered signal and said phenomena signal;
   delay means for providing a delayed test signal from said test signal; and
   third adaPter means for adapting said third filter weights as a function of said delayed test signal and said difference signal.

6. A repetitive phenomena cancellation controller according to claim 1, wherein said phase means includes means for measuring a delay between providing said cancellation signal and receipt of said phenomena signal, and adjustment means for adjusting said phase as a function of a measured delay.

7. A repetitive phenomena cancellation controller according to claim 6, wherein said phase means includes means for measuring processing delays of said processing means and said adjusting means also adjusts said phase as a function of processing delay of said processor means.

8. A repetitive phenomena cancellation control according to claim 1, wherein said phase means includes:

test signal means for generating a test signal, said test signal being provided to said output means;

third filter means for receiving said test signal and providing a filtered signal as a function of third filter weights;

difference means for Providing a difference signal of said filtered signal and said phenomena signal;

delay means for providing a delayed test signal from said test signal; and third adapter means for adapting said third filter weights as a function of said delayed test signal and said difference signal.

9. A repetitive phenomena cancellation control according to claim 1, wherein said phase means includes means for setting a Predetermined phase value.

* * * * *